United States Patent [19]

Dumbeck

[11] 4,194,178

[45] Mar. 18, 1980

[54] ELECTRIC MOTOR WITH INTERNAL WIRELESS LOAD MONITOR

[75] Inventor: Robert F. Dumbeck, Elgin, Tex.

[73] Assignee: Rexnord Inc., Milwaukee, Wis.

[21] Appl. No.: 858,657

[22] Filed: Dec. 8, 1977

Related U.S. Application Data

[63] Continuation-in-part of Ser. No. 675,780, Apr. 12, 1976, Pat. No. 4,063,112, which is a continuation-in-part of Ser. No. 548,011, Feb. 7, 1975, abandoned.

[51] Int. Cl.² ............................................. H04B 3/56
[52] U.S. Cl. ................................ 340/201 R; 340/210; 340/538; 340/648; 340/310 R; 340/187
[58] Field of Search ................ 340/531, 538, 539, 648, 340/671, 672, 310 R, 310 A, 310 CP, 201 R, 187; 318/49, 334, 317, 490; 307/89, 90, 106, 116, 120, 149

[56] References Cited

U.S. PATENT DOCUMENTS

| 1,617,092 | 2/1927 | Yamamoto et al. | 318/49 X |
| 3,378,744 | 4/1968 | Seney | 318/490 X |
| 3,525,026 | 8/1970 | Ahamed | 318/490 X |
| 3,777,234 | 12/1973 | Luger | 318/334 X |
| 3,842,408 | 10/1974 | Wells | 340/538 X |
| 4,063,112 | 12/1977 | Dumbeck | 318/490 X |

FOREIGN PATENT DOCUMENTS 1287630 1/1969 Fed. Rep. of Germany ............ 340/671

OTHER PUBLICATIONS

"Monitoring Load by Detecting Motor Slip", Reprint From Feb. 1927, *Power Transmission Design*.

*Primary Examiner*—Donald A. Griffin
*Assistant Examiner*—James L. Dwyer

[57] ABSTRACT

A self-contained modular chip within an induction motor housing detects and develops a motor operation signal, such as loading from motor characteristics such as slip analysis, and couples it by carrier current techniques to the power line for final processing in an external signal processing and meter display unit without necessitating wiring connections internally or externally to the motor.

2 Claims, 6 Drawing Figures

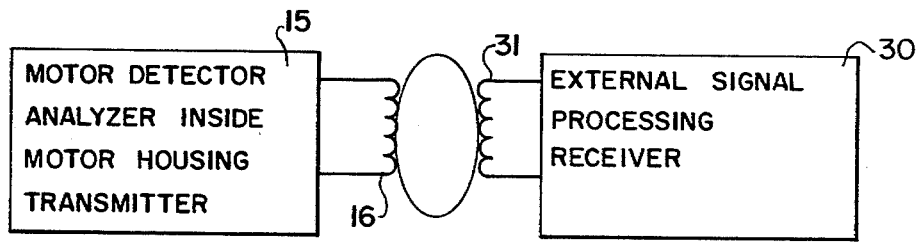
FIG. 3
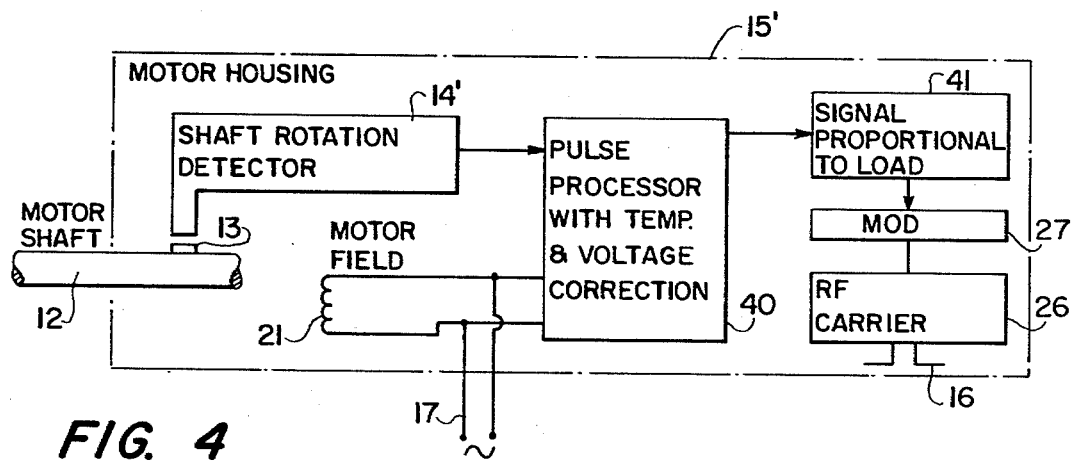
FIG. 4
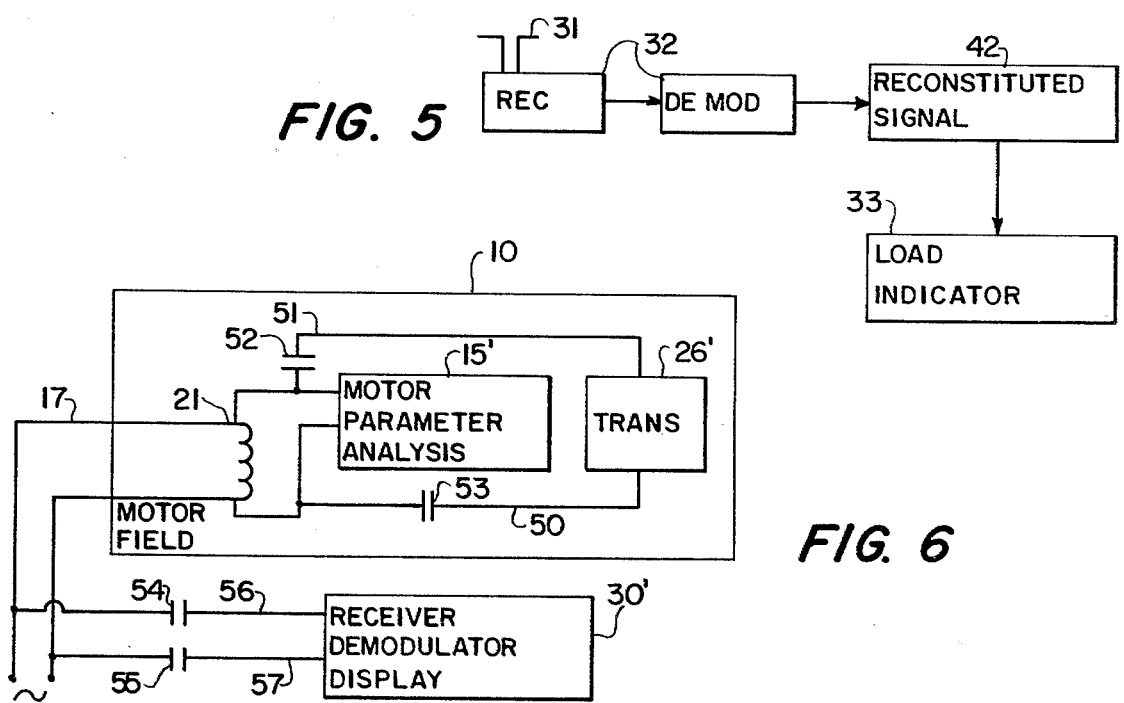
FIG. 5
FIG. 6

ELECTRIC MOTOR WITH INTERNAL WIRELESS LOAD MONITOR

This is a continuation-in-part of my copending application U.S. Ser. No. 675,780, filed Apr. 12, 1976, now U.S. Pat. No. 4,063,112 issued Dec. 13, 1977 for "Induction Motor Load Monitor and Control", which of itself was a continuation-in-part of U.S. Ser. No. 548,011 filed Feb. 7, 1975, now abandoned.

This invention relates to electric motors and more particularly it relates to electronic detection and monitoring equipment displaying the operation parameters of electric motors.

BACKGROUND OF THE INVENTION

Various types of motor parameter monitors such as load and speed indicators are known in the art. In general, these are of limited use since electric motors have many different characteristics that require special consideration. Thus, motors of the same ratings from different manufacturers usually have different operating characteristics. This means that it is very difficult to have universal monitors that accurately display the motor parameters.

Also, the matter of retrofitting motors in the field with monitors and detectors is difficult, and amounts to an economically insurmountable problem because of space limitations, access difficulties and the need for most electronic monitors to have wires connected thereto and for some to be incorporated into existing motor wiring for response to current flow, etc.

Furthermore, operating parameters vary with not only individual motor characteristics but also with applied temperatures and voltages so that it is difficult to provide precision measurements that hold over a wide range of motor operating characteristics. For example, the iron temperature and ambient temperature of a motor are different and can affect slip, current, torque, speed and other parameters. The same for changes of voltage to the motor.

There is no known prior art device that has successfully overcome all these problems, and thus limited use of motor parameter monitors has resulted.

OBJECTS OF THE INVENTION

It is therefore a general object of the invention to provide electric motor monitors overcoming some of these prior art deficiencies.

A further object of the invention is to provide electric motor monitors matched to the characteristics of individual motors which are inexpensive and universally useable under various conditions and in different installations.

Another object of the invention is to improve the accuracy of electric motor parameter monitoring systems.

A more specific object of the invention is to provide improved electronic load monitoring systems for electric induction motors.

BRIEF DESCRIPTION OF THE INVENTION

Therefore in accordance with this invention, an individually tailored parameter detector may be installed inexpensively in an electric motor at the factory that fully corresponds to the dynamic performance of that motor, and this detector may be coupled conveniently to corresponding monitoring equipment in the field. To resolve problems of access and location of intercouplings between the built-in detector and external signal processing equipment, the monitored signal is coupled to the electric motor powerlines in carrier current mode by a r-f carrier so that the monitoring equipment can be installed at any convenient location to pick up the dynamic motor parameter signal without wiring or access to internal space compartments of the motor, or distortion of any kind in the signal characteristics. Because of factory installation the detector can be engineered for compatible operation with the particular motor characteristics, and can be located in a non-interfering place within the motor housing, where changes in motor temperature and motor operating voltage, for example, are present, so that exact parameter conditions are monitored for better accuracy. The signal is then conveyed to an external circuit further processing displaying and conveying the monitored and processed motor parameter signals for appropriate use.

In a preferred embodiment, the load characteristic of an induction motor is monitored by detecting pulses from the motor shaft revolution and processing them by slip analysis to relate to the loading on the motor. The detector portion is mounted on an electronic chip within the motor housing to modulate a carrier current r-f transmitter which induces the desired signal into the electric power line to the motor for external detection. The external detector-demodulator located somewhere along the power line then can process the signal for alarm or display purposes, and yet can monitor exact temperatures, voltages, currents, etc., within the motor as it operates dynamically under different conditions.

THE DRAWING

Other objects, features and advantages of the invention will be found throughout the following more detailed specification which refers to the accompanying drawing, wherein:

FIG. 3 is a diagrammatic system block diagram illustrating the wireless transmission of signals detected within the motor to external signal processing circuitry;

FIG. 4 is a one line block circuit diagram of a motor load monitoring transmitter system disposed within a motor housing;

FIG. 5 is a one line block circuit diagram of an external monitoring receiver for processing dynamic motor parameter signals transmitted from circuits within the motor housing; and FIG. 6 is a block circuit diagram showing an embodiment of the invention conductively coupled from within the motor housing out through existing power line conductors.

DETAILED DESCRIPTION OF THE INVENTION

The hereinbefore mentioned parent application and a continuation-in-part thereof U.S. Ser. No. 858,674, filed concurrently herewith for "Armature Slip Analysis of Induction Motors with Temperature and Voltage Correction" are included in entirety by reference herein and constitute a part of the teachings herein. However, only those portions necessary to an understanding of this invention are explicitly set forth herein in order to avoid obscuring the nature of the invention with unnecessary detail.

These other applications show circuitry and systems for analyzing the slip of induction motors for producing load indications or alarms and methods of improving the instrumentation accuracy with feedback, range adjustments and temperature-voltage variation compensation. Another example of the load analyzers and slip analysis is set forth in the Feb. 1977 issue of *Power Transmission Design* in an article entitled "Monitoring load by detecting motor slip". This shows motor curves and describes the operation of the system starting with a sensor proving one pulse each shaft rotation and ending in a meter displaying the percentage of motor load. A portable version is identified therein as one embodiment having an internal infrared pulsed transmitter and receiver that senses shaft rotation without physical mounting of the sensor adjacent the motor shaft.

Figure 1:
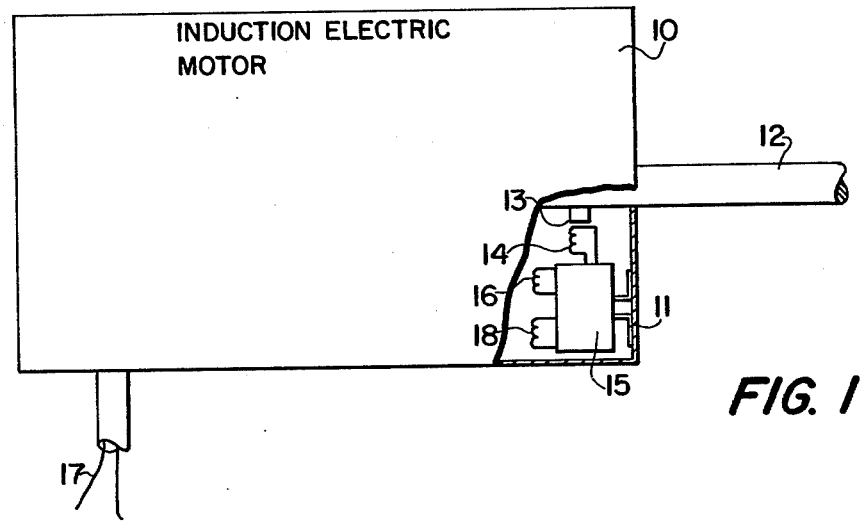
FIG. 1 is a sketch of a motor housing broken away to show an internally disposed electronic chip of the wireless type that detects and transmits motor operating parameters.

In the present invention as seen from FIG. 1, there is mounted inside an electric motor housing 10 an electronic circuit chip 15 by means of brackets 11 or otherwise to communicate with shaft 12 rotation to sense the marker 13 by means of a pickup transducer 14. A circuit portion of chip 15 processes the shaft rotation signals and converts them to r-f signals radiated by a coil 16 to electromagnetically induce signals into the motor power line cord 17 in the carrier current mode. So that the chip can be completely wireless without necessitating any wiring connections to the internal motor wires, a further pickup coil 18 is provided into which operational power for the electronic circuit chip is induced by motor or shaft rotation. For example this may be done by means of a permanent magnet rotated by shaft 12 or by placing the coil 18 to receive induced electromagnetically coupled A-C current or a portion of the fluctuating motor field energy from the motor.

Figure 2:
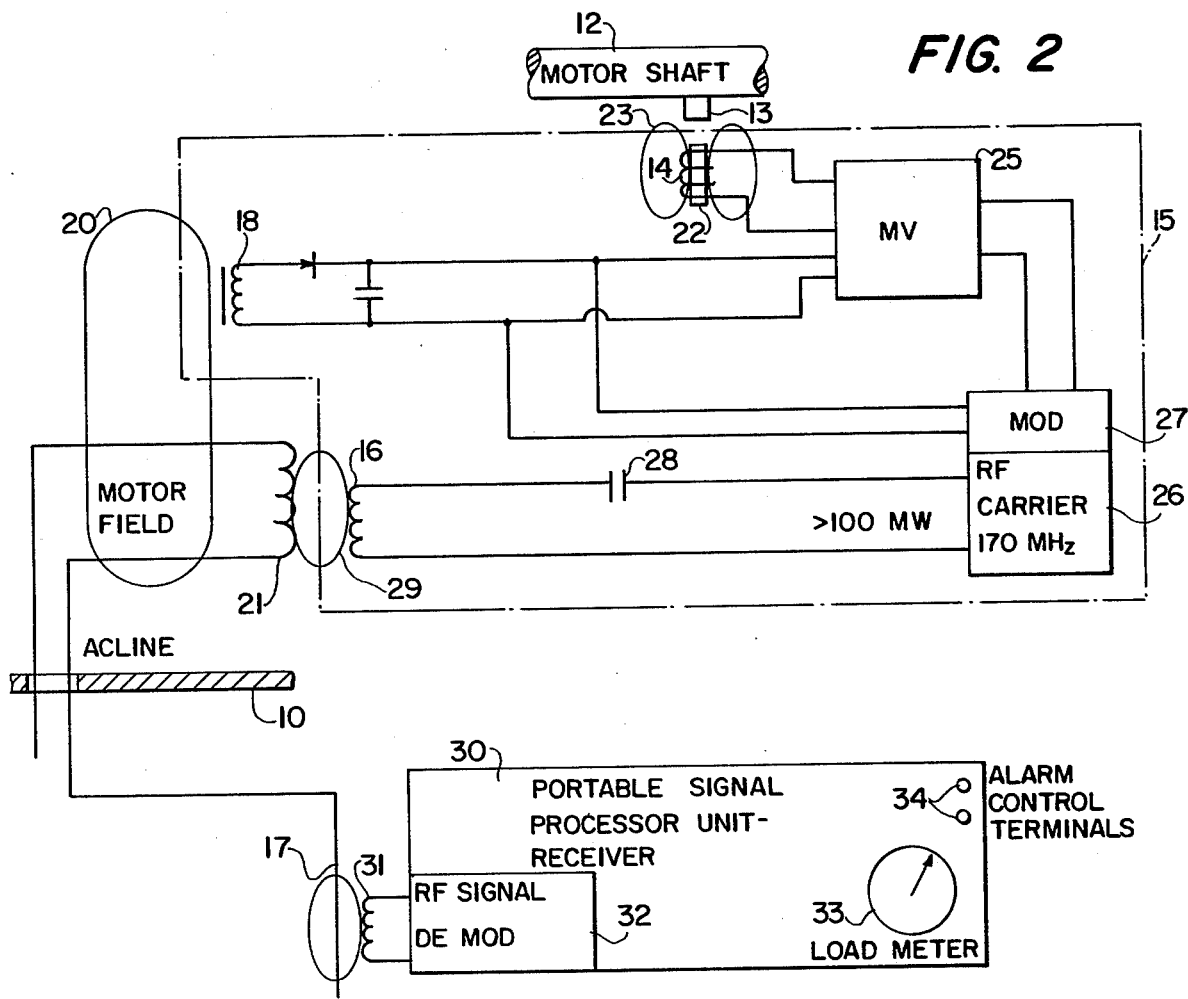
FIG. 2 is a schematic representation, partly in block diagram form of a motor parameter monitoring and display system embodying the invention.

As may be seen from the more detailed presentation of one embodiment of the invention in FIG. 2, the coil 18 by way of electromagnetic linkages 20 coupled from the motor field coil 21, for example, will provide A-C power to a rectifier diode-capacitor power supply arrangement for deriving appropriate voltage and current to operate electronic transistorized circuitry on the circuit chip 15.

In this embodiment the shaft rotation sensing coil 14 may have a permanent magnet core 22 and be of the type described in my copending application above-identified. Thus, for each shaft revolution the magnetic field pattern 23 is disturbed by marker 13, which is a groove or ridge on motor shaft 12, to produce one pulse per shaft rotation. This pulse may be processed by shaping in a one shot multivibrator circuit 25, and the shaped and timed pulses are then modulated onto the r-f carrier of transmitter 26 via modulator circuit 27. To avoid ICC licensing requirements output radiated power is less than 100 milliwatts and a typical carrier frequency is 170 MHz.

Preferably the shaped pulses from multivibrator 25 occurring in the order of 30 per second with 1800 RPM synchronous shaft rotation speed are modulated in modulator 27 on an i-f carrier of one to five kilohertz which in turn is modulated on the r-f carrier to be radiated, so that there can be no interference or confusion with any of the 60 Hz A-C component of the motor power line, field pattern, etc. In this way the sensed shaft rotation signals are completely isolated from any related A-C motor noise signals and they are easily detected and demodulated. Transmitter and receiver equipment operating in this type of carrier current mode are per se well known and conventional in the art.

For further isolation of lower frequency noise components, capacitor 28 may be used as an r-f pass filter in the transmitter radiation circit along with output coil 16. This coil 16, or equivalent transmitter antenna device, then by electromagnetic field 29 is coupled into the power line 17 for the motor such as by inducing in the motor field coil or its leads the appropriate r-f signal. Therefore, the r-f modulated carrier passes outside the motor housing 10, generally iron, along power line cord lead 17 where it may be sensed by receiver 30, typically by pick up coil 31 or equivalent antenna.

A conventional receiver detector-demodulator circuit 32 then transforms the sensed pulses in receiver 30 to substantially identical form of the shaped pulses received from motor shaft 12. The processing circuitry for providing from the detected shaft rotation pulses either a load indication on meter 33 or at alarm control terminals 34 may be those slip analysis circuits set forth in either the above-referenced patent or the concurrently filed application.

For example, motor temperature or voltage can be monitored as set forth in the copending concurrently filed application above-identified, and if internal wiring to circuit chip 15 from motor circuits is added, such parameters as armature or field current may likewise be monitored. A simplified block diagram of the system is set forth in FIG. 3 wherein transmitter 15 located inside the motor housing communicates by electromagnetic radiation with an external signal processing receiver 30, which in a preferred embodiment is a load monitor meter processing by slip analysis techniques shaft rotation pulses to indicate on a meter or relay the percentage of full rated load at which the motor is dynamically operating.

For monitoring electric voltage variations to the motor, internal connections may be desirable to the motor power lines inside the motor. In such cases there could be conductive connection of signals into the power line conductors for transmission outside, and the power supply for the chip circuitry might advantageously be derived by conventional circuit wiring connection to the motor power conductors within the motor housing at the slight additional expense and inconvenience of assembly wiring when the motor is manufactured. A conductive connection to the power conductors 17 is shown to the pulse processing circuit 40 in FIG. 4. A modification embodiment as shown in FIG. 6 provides for conductive wiring connection into the power line rather than carrier current induction therein.

In FIG. 6, the power line conductor 17 is conductively coupled to the chip motor parameter analysis circuitry 15' and processed as hereinbefore explained for transmission of signals externally from the motor housing 10 by means of transmitter 26'. In this case since connections to the power line conductors are otherwise made, an additional conductive connection by way of leads 50, 51 and D-C plus low frequency A-C blocking capacitors 52, 53 couple the signals to be transmitted to the power line 17 conductors for transmissions outside the motor housing 10. Similarly receiver 30' is conductively connected outside the housing to power line conductors at an accessible location by conductors 56, 57 and blocking capacitors 54, 55.

It is seen that this is advantageous because extra connections need not be made through the motor housing for the metering equipment, the necessary power line conductors only being used. Also, the receiver 30' then need not be adjacent the motor site but may be at any desired location where the power line conductors 17 are accessible.

It is readily seen that this permits each manufacturer to take into account the exact opening characteristics of a motor line in design of the circuitry within the motor housing and thus errors in field installation because of lack of enough information about motor operating conditions are avoided. This therefore provides not only more economical installations but higher accuracy and preciseness of measurement. Furthermore, the exact operating temperatures and voltages in situ may thus be detected for making corrections to motor slip analysis data or for other processing conditions such as temperature signal alarms. The copending concurrently filed application has typical preferred circuit embodiments for sensing and processing motor temperature and voltage variations.

The circuitry on the chip 15 within the motor housing can vary and include additional processing circuits as for example in the embodiment of FIG. 4. Signals may be processed and prepared in either analog or digital form for modulating on the r-f carrier at transmitter 26 by such circuitry as set forth in the hereinbefore identified patent. It is particularly advantageous in slip analysis for determining load to provide for correction signals for temperature and voltage variations as indicated by circuit 40.

Circuit details for this type of processing are set forth in the copending concurrently filed application and result in an output corrected signal more precisely related under various dynamic load and voltage conditions to the actual motor load. Thus, the corrected signal proportional to the load as indicated at 41 in FIG. 4 is then modulated upon the carrier for carrier current mode of transmission to the receiver circuit of FIG. 5, which is located externally of the motor housing at any convenient location near the electric power line conductors that supply motor power. The demodulated and reconstituted signal available at 42 is then displayed typically on a meter or alarm relay load indicator 33.

It is desirable to have a more comprehensive circuit arrangement on the chip within the motor as outlined in FIG. 3 whenever there are special parameters or characteristics of a particular motor line that can affect or change the accuracy and precision of the measurements beyond desired tolerance ranges. The circuits therefore can be designed for factory installation and the signals read out or processed by simplified metering equipment when desired. Consider the importance of this in light of the lack of specifications for example whether full rated load RPM of a particlular motor is at 25° C. or the normally higher operating temperature under load, which can vary as the particular load or operating environment changes. Thus, the techniques of this invention provide that synergy of dynamic following of the exact in situ characteristics of each individual motor line for any kind of motor characteristics to be monitored at an economical price and without requiring any retrofit installation problems.

Having therefore advanced the state of the art in monitoring motor parameters, those novel features believed descriptive of the spirit and nature of the invention are defined with particularity in the appended claims for which Letters Patent are petitioned.

What is claimed is:

1. An electric motor load monitor comprising: a detector and slip analysis circuit mounted within the motor housing and that produces a signal indication of motor load by slip analysis means; said slip analysis circuit further including means responsive to power line voltage variations and which corrects the motor load signal for such variations; a modulator and transmitter mounted within the motor housing that impresses a modulated motor load signal of radio frequency onto the line that supplies power to the motor for transmitting the modulated motor load signal outside the motor housing on the power line; a receiver outside the motor housing capable of receiving the modulated motor load signal impressed on the power line; and a demodulator for transforming the received signal to produce the motor load signal.

2. The monitor of claim 1 wherein the slip analysis circuit further includes means responsive to motor temperature variations and which also corrects the motor load signal for such variations.

* * * * *